United States Patent
Matsumoto (10) Patent No.: US 6,757,758 B1
(45) Date of Patent: Jun. 29, 2004

(54) DATA TRANSFER METHOD, DATA TRANSFER APPARATUS AND RECORDING APPARATUS

(75) Inventor: Masashi Matsumoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 460 days.

(21) Appl. No.: 09/625,844

(22) Filed: Jul. 26, 2000

(30) Foreign Application Priority Data

Jul. 26, 1999 (JP) .......................................... 11-210834

(51) Int. Cl.[7] .............................................. G06F 13/00
(52) U.S. Cl. .............................. 710/68; 710/2; 710/30; 346/78; 346/79
(58) Field of Search ............................. 710/30, 33–35, 710/68, 2; 346/78, 79

(56) References Cited

U.S. PATENT DOCUMENTS

| | | | | |
|---|---|---|---|---|
| 5,049,880 A | * | 9/1991 | Stevens ........................ 341/63 |
| 5,479,587 A | * | 12/1995 | Campbell et al. ........... 358/1.17 |
| 5,526,025 A | * | 6/1996 | Selwan et al. ............... 345/556 |
| 5,663,726 A | * | 9/1997 | Bakhmutsky ................. 341/67 |
| 5,676,475 A | * | 10/1997 | Dull ............................ 400/174 |
| 5,778,253 A | * | 7/1998 | Blair et al. .................... 710/68 |
| 5,864,716 A | * | 1/1999 | Wishneusky .................. 710/68 |
| 5,880,754 A | * | 3/1999 | Niikura et al. ................. 347/18 |
| 5,982,937 A | * | 11/1999 | Accad ......................... 382/239 |

* cited by examiner

Primary Examiner—Jeffrey Gaffin
Assistant Examiner—Eron Sorrell
(74) Attorney, Agent, or Firm—Fitzpatrick, Cella, Harper & Scinto (57) ABSTRACT

The invention is to simplify the process from pack bits compression to data transfer, thereby improving throughput. For this purpose there are provided a tag generation unit for reading the data stored in the pre-compression data reception buffer, generating a tag from the read data and writing only the tag in the pre-compression data reception buffer, a tag/data selection unit for suitably reading the tag and the data from the pre-compression data reception buffer while analyzing the tag and transferring the data to a transfer control unit, and a transfer control unit for transferring the data from the tag/data selection unit to a host equipment together with a control signal, according to the protocol of an interface with such host equipment.

18 Claims, 8 Drawing Sheets

| ADDRESS | 00 | 01 | 02 | 03 | 04 | 05 | 06 | 07 | 08 | 09 | 0A | 0B | 0C | 0D | 0E | 0F |
|---|---|---|---|---|---|---|---|---|---|---|---|---|---|---|---|---|
| DATA BEFORE COMPRESSION | 10 | 11 | 12 | 13 | 00 | 00 | 00 | 00 | 00 | 00 | 00 | 00 | 00 | 20 | 21 | 22 |

FIG. 2B

| ADDRESS | 00 | 01 | 02 | 03 | 04 | 05 | 06 | 07 | 08 | 09 | 0A | 0B | 0C | 0D | 0E | 0F |
|---|---|---|---|---|---|---|---|---|---|---|---|---|---|---|---|---|
| DATA AFTER COMPRESSION | 03 | 10 | 11 | 12 | 13 | F8 | 00 | 00 | 00 | 00 | 00 | 00 | 00 | 02 | 20 | 21 | 22 |

PRIOR ART

FIG. 3

PRIOR ART

FIG. 4A

| ADDRESS | 00 | 01 | 02 | 03 | 04 | 05 | 06 | 07 | 08 | 09 | 0A | 0B | 0C | 0D | 0E | 0F |
|---|---|---|---|---|---|---|---|---|---|---|---|---|---|---|---|---|
| DATA BEFORE COMPRESSION | 10 | 11 | 12 | 13 | 00 | 00 | 00 | 00 | 00 | 00 | 00 | 00 | 00 | 20 | 21 | 22 |

PRIOR ART

FIG. 4B

| ADDRESS | 00 | 01 | 02 | 03 | 04 | 05 | 06 | 07 | 08 | 09 | 0A | 0B | 0C | 0D | 0E | 0F |
|---|---|---|---|---|---|---|---|---|---|---|---|---|---|---|---|---|
| DATA AFTER COMPRESSION | 03 | 10 | 11 | 12 | 13 | F8 | 00 | 02 | 20 | 21 | 22 | | | | | |

DATA TRANSFER METHOD, DATA TRANSFER APPARATUS AND RECORDING APPARATUS

BACKGROUND OF THE INVENTION

1. Field of the Invention

The present invention relates to a data transfer method, a data transfer apparatus and a recording apparatus, and more particularly to a data transfer method, a data transfer apparatus and a recording apparatus for compression transfer of data such as image data, by pack bits compression method in which a tag is given to each unit consisting of a continuous data train containing same data in continuation or a non-continuous data train containing non-same data.

2. Related Background Art

As the information output apparatus for a word processor, personal computer, facsimile or the like, there is already known a printer capable of recording desired information such as characters or an image on a sheet-shaped recording medium such as a paper or film.

There is also recently known a printer capable, in addition to the ordinary recording function, of mounting a scanner unit instead of a recording head which is detachably mounted in such printer and of transferring the image data, read by such scanner unit, to a host equipment.

In the conventional printer, data transferred to a host equipment is of a relatively limited data amount such as error information, but, in the above-described printer with the scanner function, it becomes necessary to transfer a large amount of data, read by the scanner unit, to the host equipment.

In the transfer of recording data from a host equipment to a printer, if the data transfer is executed without data compression, the transfer rate of interfaces connecting the host equipment and the printer generally becomes a bottleneck whereby the throughput of the entire system cannot be increased. In order to overcome such drawback, there has been adopted a method of decreasing the amount of the data to be transferred for example by the pack bits compression, thereby improving the throughput of the entire system.

Also in case of data transfer from the printer to the host equipment, it is conceivable to adopt a compression such as pack bits compression, but such compression increases the burden on the CPU, leading to drawbacks or retarding other processes.

Figure 3:
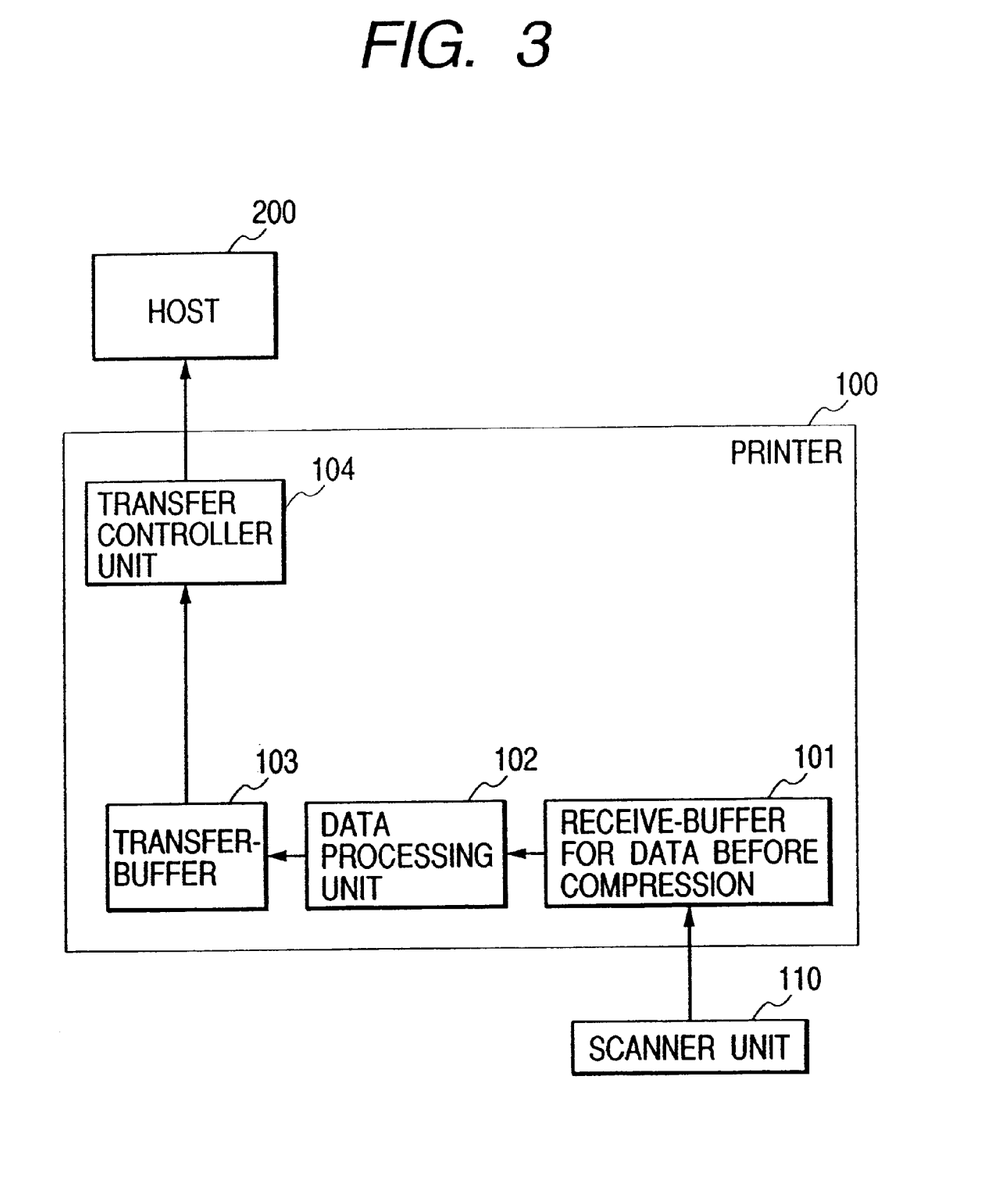
FIG. 3 is a block diagram showing the functional configuration of a conventional data transfer apparatus.

FIG. 3 is a functional block diagram of a portion for executing data transfer in the conventional printer provided with a scanner unit.

Referring to FIG. 3, data read by a scanner unit 110 are transferred to a printer 100 and are written in a pre-compression data reception buffer 101. A data processing unit 102 reads data stored in the pre-compression data reception buffer 101, generates a tag from the read data and writes the tag and the data in a transfer buffer 103. A transfer control unit 104 transfer the data of the transfer buffer 103 to a host equipment 200 together with a control signal according to the protocol of an interface with the host equipment 200.

Figure 4A:
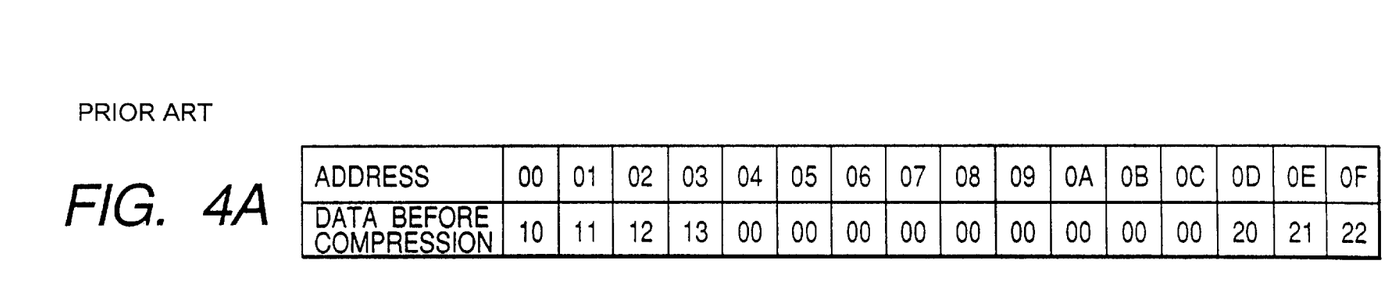
FIGS. 4A and 4B are views respectively showing data received by the data transfer apparatus shown in FIG. 3 and data of a transfer buffer thereof.
Figure 4B:
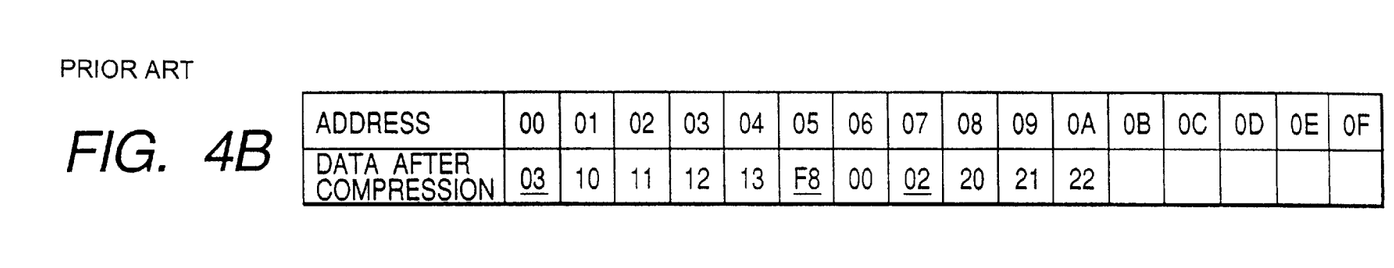

FIGS. 4A and 4B respectively show examples of data before pack bits compression, stored in the pre-compression data reception buffer 101 and data after ordinary compression, processed by the data processing unit 102 and stored in the transfer buffer 103. The data after ordinary compression consist of repeated cycles of a tag, data, a tag, data, . . . (tags being indicated by underlines).

In the following there will be explained the process executed in the data processing unit 102.

As a tag is written in an initial write address 00, the address is advanced beforehand. As the initial data (at address 00) in the pre-compression data reception buffer are "10", data "10" are written in a write address 01 of the transfer buffer. As the next data (at address 01) are "11", data "11" are written in a write address 02. The reading process is continued with counting of the number of non-continuous data in parallel.

When the data in the pre-compression data reception buffer are read up to the address 05, it is known that the data of the address 04 are same as those of the address 05. It is therefore known that the number of the non-continuous data is four. Thus the write address of the transfer buffer is returned to 00, and there is written a tag 03 (0000 0011b) indicating that the number of the non-continuous data is four.

Thereafter reading of the data from the pre-compression data reception buffer 101 and writing of the tag and the data into the transfer buffer 103 are similarly continued, executing counting of the number of the continuous and non-continuous data.

In the compression process, as explained in the foregoing, it is necessary to write the tag after reading plural units of data in order to attach the tag in front of the data, and there is required a complex process such as address management. On the other hand, the thawing (expansion) process for decompressing the compressed data is relatively simple as it can be realized by successively reading the data collectively by a number of units indicated by the tag.

In general, the CPU of the host equipment is higher in performance than the CPU of the printer, so that the data processing becomes balanced in case the data compressed by the CPU of the host equipment are thawed by the printer, but the data compression process in the printer requires a long time whereby the throughput in the entire system cannot be improved.

Therefore, in case of transferring the image data read by the scanner unit from the printer to the host equipment, the data are often transferred without compression in the conventional configuration, since the entire process time is often shorter in such data transfer without compression than the data compression and the data transfer in combination.

However, with the recent progress in the resolution and definition of the scanner unit, the amount of the read image data, namely the amount of the data to be transferred, has shown a drastic increase, thereby resulting in a significant increase in the time required for data transfer.

Consequently the function of compressing the data received from the scanner unit within the printer and transferring such data at a high speed to the host equipment has become indispensable.

Such situation is not limited to the printer but is likewise encountered in other peripheral equipment having a function of transferring data of a large amount such as image data to a host equipment such as a personal computer.

SUMMARY OF THE INVENTION

In consideration of the foregoing, the object of the present invention is to provide a data transfer method, a data transfer apparatus and a recording apparatus capable of simplifying the process from compression to data transfer, thereby improving the throughput of the entire system.

The above-mentioned object can be attained, according to the present invention, by a data transfer method for compression transfer of data by attaching a tag in the unit of a continuous data train in which same data are present in continuation and a non-continuous data train consisting of non-same data, the method comprising:

a step of reading data stored in a buffer; a tag generation step of generating a tag in the unit of the continuous data train and the non-continuous data train and overwriting, with such tag, an area other than the area storing the aforementioned non-continuous data in the buffer; and a data control step of executing compression transfer of the data by reading the tag from the buffer and transferring the data in the buffer according to the tag.

The above-mentioned object of the present invention can also be attained by a data transfer apparatus for compression transfer of data by attaching a tag in the unit of a continuous data train in which same data are present in continuation and a non-continuous data train consisting of non-same data, the apparatus comprising:

a buffer for storing data; tag generation means for generating a tag in the unit of the continuous data train and the non-continuous data train and overwriting, with such tag, an area other than the area storing the aforementioned non-continuous data in the buffer; and data control means for executing compression transfer of the data by reading the tag from the buffer and transferring the data in the buffer according to the tag.

The above-mentioned object of the present invention can also be attained by a recording apparatus comprising the above-mentioned data transfer apparatus and a carriage for scanning, by a reciprocating motion, a recording medium.

More specifically, in the present invention, in compressing the data of a buffer by a format according to pack bits compression, the data are read from the buffer to generate a tag, then thus generated tag is overwritten in an area of the buffer other than the area where non-same data are present in continuation, then the tag is read from the buffer and the data in the buffer are transferred in a format of the pack bits compression, according to such tag.

In this manner the rearrangement of data becomes unnecessary in compressing the data of the buffer by the pack bits compression, and the number of data writing is also reduced, whereby the data processing for data compression can be achieved with a higher speed.

Such data processing is particularly effective in a printer or the like having a scanner unit to be mounted on a carriage in place for the recording head, because the transfer time can be shortened in transferring the read image data to an external equipment such as a host equipment whereby the throughput of the entire system can be improved.

DESCRIPTION OF THE PREFERRED EMBODIMENTS

In the following, the present invention will be clarified in detail by preferred embodiments thereof, with reference to the accompanying drawings.

Figure 5:
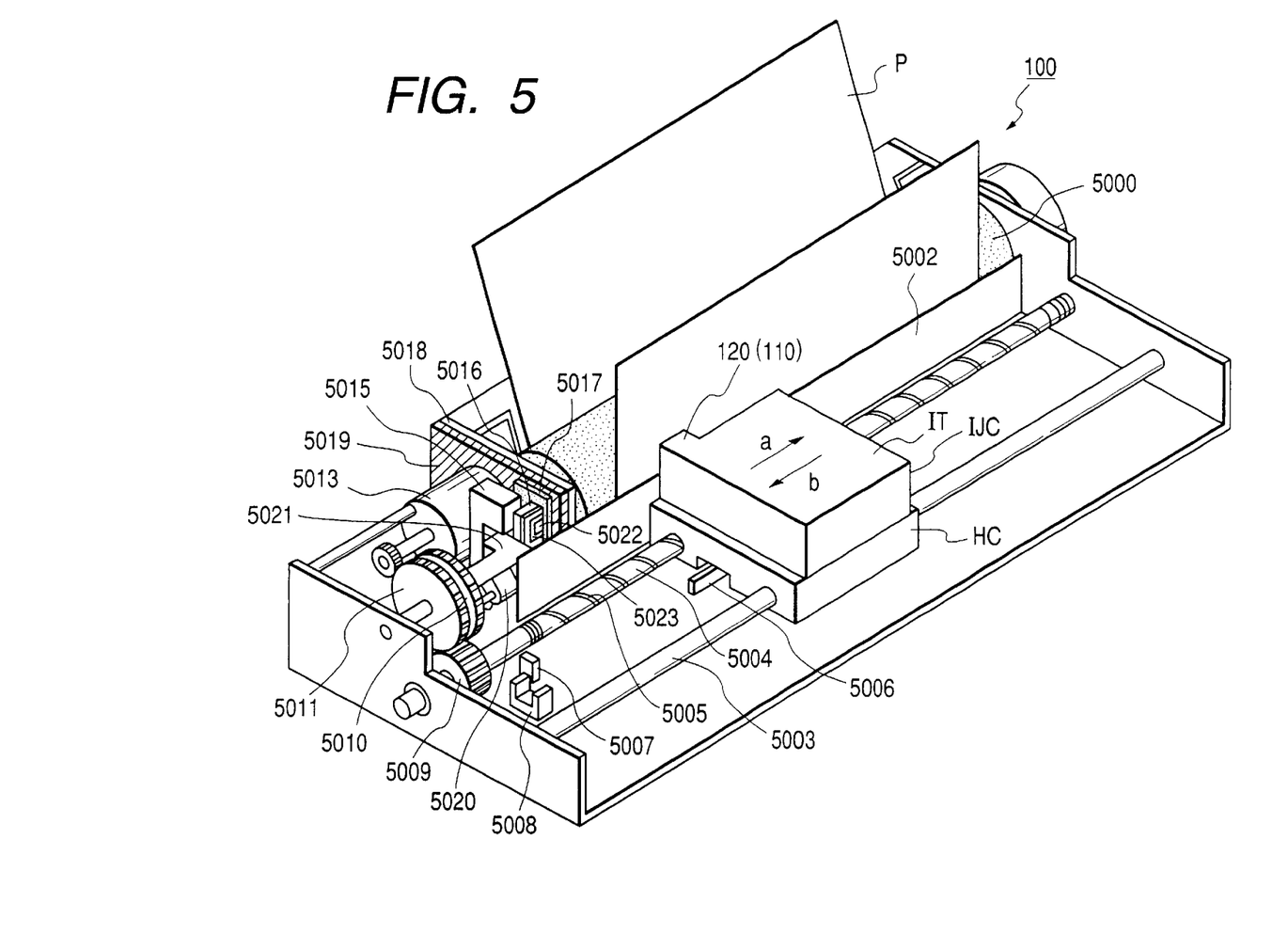
FIG. 5 is an external perspective view showing the schematic configuration of an ink jet printer, constituting a representative example of the recording apparatus equipped with the data transfer apparatus of the present invention.

FIG. 5 is an external perspective view schematically showing the configuration of a printer 100, constituting a representative embodiment including a data transfer apparatus of the present invention. A printer 100 of the present embodiment is an ink jet printer, forming a record by discharging ink onto a recording medium, from a recording head in accordance with an ink jet system.

Referring to FIG. 1, a carriage HC engaging with a spiral groove 5004 of a lead screw 5005 which is rotated by the forward or reverse rotation of a driving motor 5013 through transmission gears 5009 to 5011 is provided with a pin (not shown), and is supported by a guide rail 5003 to executes reciprocating motion in directions a, b. The carriage HC supports an integral ink jet cartridge 120 incorporating a recording head IJH and an ink tank IT.

A paper pressing plate 5002 presses a recording paper P toward a platen 5000 along the moving direction of the carriage HC. Photocouplers 5007, 5008 constitute a home position detector for detecting the presence of a lever 5006 of the carriage in the area of such detector, and accordingly switching the rotating direction of the motor 5013.

There are also provided a member 5016 supporting a cap member 5022 for capping the front face of the recording head IJH, a suction unit 5015 for sucking the interior of the cap member, thereby executing suction recovery of the recording head through an aperture 5023 in the cap member. A cleaning blade 5017 and a member 5019 for moving the cleaning blade front and back are supported by a supporting plate 6018 of the main body. The cleaning blade is not limited to the illustrated form but can naturally assume any known form.

A lever 5021 for starting the sucking operation of the suction recovery is moved by the movement of a cam 5020 engaging with the carriage, and is moved and controlled by the driving force of the driving motor through a known transmission mechanism such as a clutch.

The operations of capping, cleaning and suction recovery are respectively executed in the respective positions by the function of the lead screw 5005 when the carriage is brought to the area at the home position side, but there may be adopted any configuration as long as the desired operations can be executed at the known timings.

The printer 100 of the present embodiment is so constructed as to function also as a scanner, by mounting a scanner unit 110 in place for the ink jet cartridge 120 on the carriage HC. In such case, the printer is preferably so constructed as to automatically judge whether the ink jet cartridge 120 or the scanner unit 110 is mounted, for example by the shape of the electrodes in a connecting portion of the ink jet cartridge 120 and the scanner unit 110 with the carriage HC.

In the following there will be explained the control configuration for executing the recording control in the above-described apparatus.

In the present embodiment, the data transfer apparatus will be explained with reference to the internal configuration of the printer, but the data transfer apparatus is not limited to such configuration of the printer.

Figure 6:
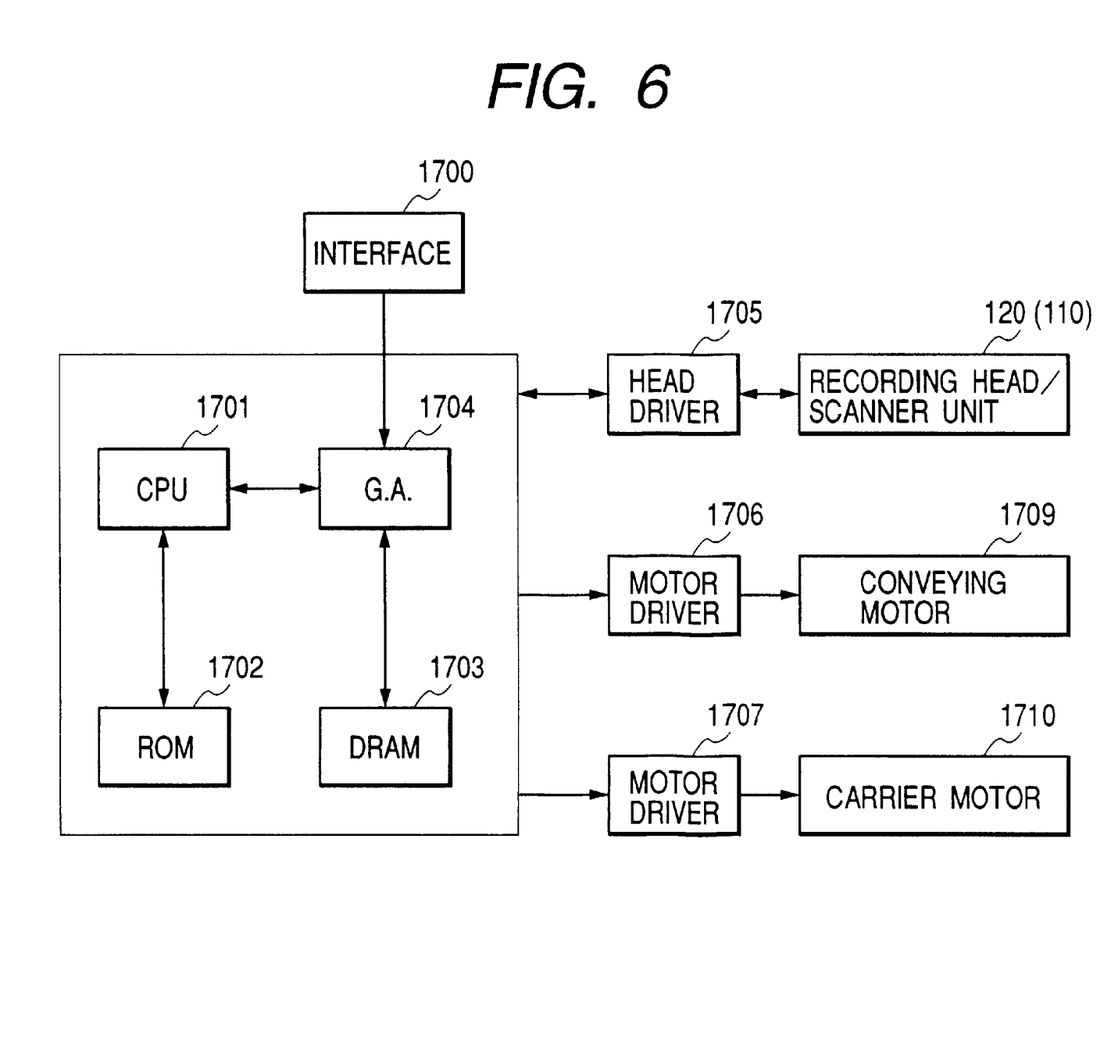
FIG. 6 is a block diagram showing an example of the control configuration in the ink jet printer shown in FIG. 5.

FIG. 6 is a block diagram showing the configuration of a control circuit of the printer 100. Referring to FIG. 6, the control circuit is provided with a CPU 1701, an ROM 1702 storing a control program to be executed by the CPU 1701, a DRAM 1703 storing various data (aforementioned recording signal and recording data to be supplied to the recording head), a gate array (G.A.) 1704 for controlling the supply of the recording data to the recording head 120 and for controlling the data transfer among an interface 1700, the CPU 1701 and the RAM 1703, a carrier motor 1710 for carrying the recording head 120 and the scanner 110, a conveying motor 1709 for conveying the recording sheet, a head driver 1705 for driving the recording head, and motor drivers 1706, 1707 for respectively driving the conveying motor 1709 and the carrier motor 1710.

The above-described control configuration functions in the following manner. In executing a recording operation, when the recording signal is entered into the interface 1700, it is converted into recording data for printing between the gate array 1704 and the CPU 1701. Then the motor drivers 1706 and 1707 are activated, and the recording head 120 is driven according to the recording data supplied to the head driver 1705, whereby the recording is executed.

On the other hand, in the function as a scanner, the image data read by the scanner unit 110 mounted instead of the recording head 120 are stored, without any processing by the head driver 1705, in the DRAM 1705, then compressed by the CPU 1701 or the gate array 1704 and transferred to the host computer through the interface 1700.

In the foregoing description, the control program to be executed by the CPU 1701 is assumed to be stored in the ROM 1702, but it is also possible to add a memory capable of erasure/writing such as an EEPROM thereby enabling to change the control program from the host computer or the like connected to the printer 100.

In the following there will be explained the compression/transfer process of the data in the printer of the present embodiment.

Figure 1:
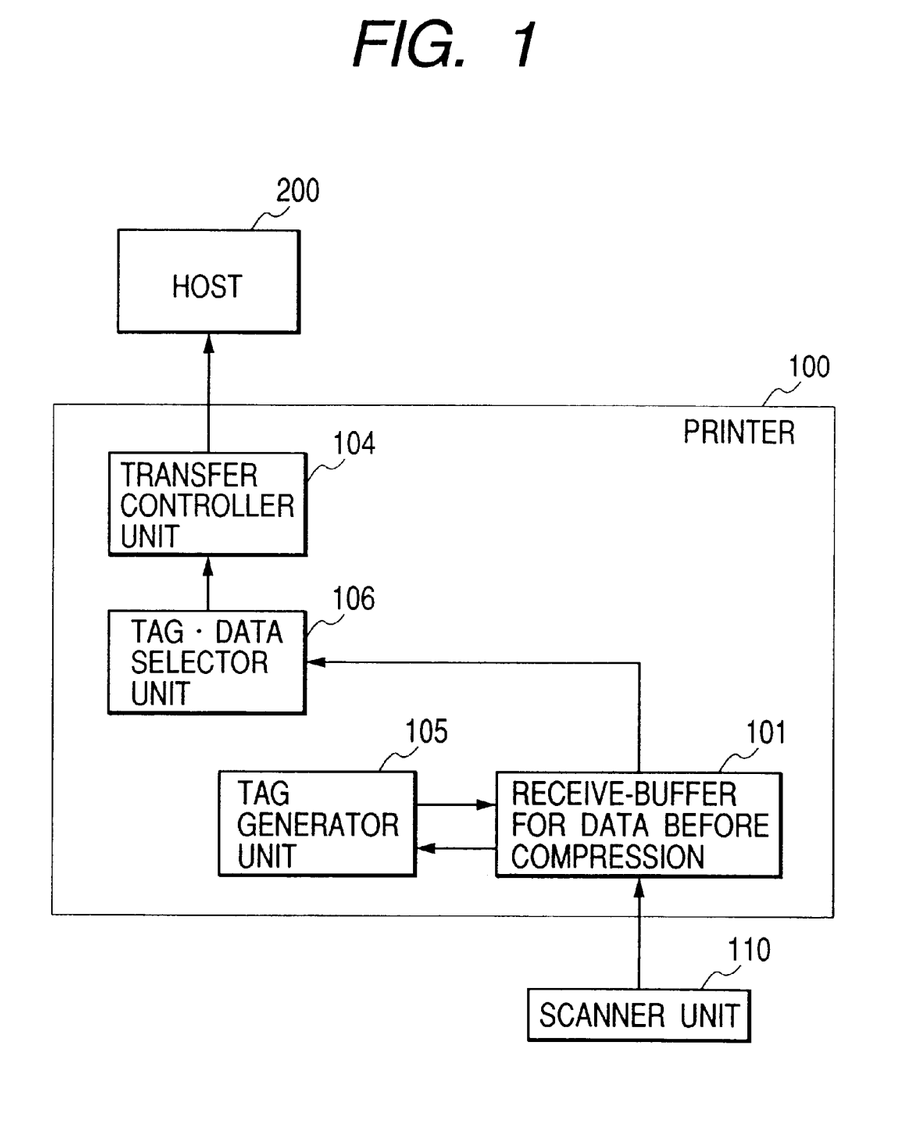
FIG. 1 is a block diagram showing the functional configuration of a data transfer apparatus of the present invention.

FIG. 1 is a functional block diagram of a portion, executing data transfer, of the printer 100 of the present embodiment. The printer 100 is provided with a pre-compression data reception buffer (receive-buffer for data before compression) 101, a tag generation unit 105, a tag/data selection unit 106, and a transfer control unit 106. In comparison with the control configuration shown in FIG. 6, the pre-compression data reception buffer 101 corresponds to the DRAM 1703, the tag generation unit 105 and the tag/data selection unit 106 correspond to the CPU 1701 and/or the gate array 1704, and the transfer control unit 104 corresponds to the interface 1700.

Referring to FIG. 1, the image data read by the scanner unit 110 are written into the pre-compression data reception buffer 101. The tag generation unit 105 reads the data stored in the pre-compression data reception buffer, then generates a tag from the read data and writes the tag only in the pre-compression data reception buffer 101. The tag/data selection unit 106 suitably read the tag and the data from the pre-compression data reception buffer 101 while analyzing the tag and transfers the data to the transfer control unit 104. The transfer control unit 104 transfers the data from the tag/data selection unit to the host equipment 200 together with a control signal, according to the interface protocol with the host equipment.

Figures 2A, 2B:
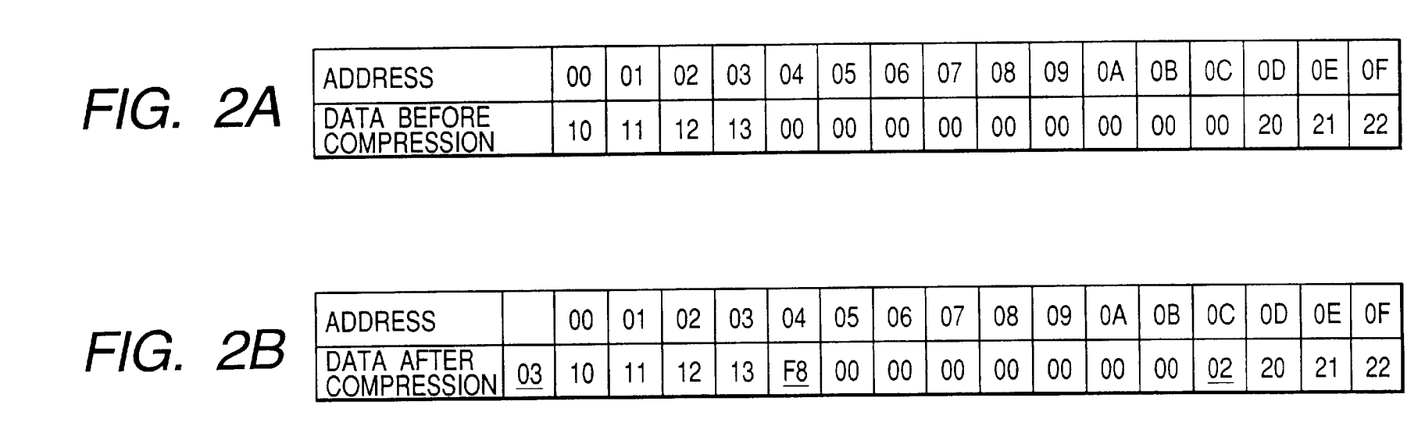
FIGS. 2A and 2B are views showing data received by the data transfer apparatus shown in FIG. 1 and data generated by a tag generation unit thereof.

FIGS. 2A and 2B are views showing examples of data (FIG. 2A) written from the scanner unit 110 into the pre-compression data reception buffer 101 and data (FIG. 2B) after processing by the tag generation unit 105.

The tag generation unit 105 of the present embodiment overwrites, with the tag, an area other than the area of the pre-compression data reception unit 101 where non-same (non-continuous) data are present in continuation, namely the start and the end of the continuous data. However, if non-continuous data are present at first, a specified address, such as an address immediately preceding the address of the initial data, is overwritten by the tag.

Referring to FIG. 2A, the reception data consists of a data train of four non-continuous data (addresses 00 to 03), a data train of nine continuous data (address 04 to 0C) and a data train of three non-continuous data (addresses 0D to 0F). The tag is generated by subtracting the number of continuous bits from 00 (0000 0000b) in case of continuous data, or by adding the number of non-continuous bits to 00 in case of non-continuous data. Therefore, the tags corresponding to these data trains are respectively 03 (0000 0011b in bit representation), F8 (1111 1000b) and 02. Thus, the continuous data train and the non-continuous data train can be distinguished by the most significant bit "1" and "0", respectively.

In FIG. 2B, the tag "03", indicating the four non-continuous data, is written in a specified address different from the data area in the pre-compression data reception buffer, for example an address immediately preceding the area storing the data. The area of the addresses 00 to 03 is not overwritten as it contains four non-continuous data.

The area of the addresses 04 to 0C contains 9 continuous data and is a portion capable of compression. The address 04 is overwritten by the tag F8, indicating 9 continuous data.

As the area of the addresses 0D to 0F contains 3 non-continuous data, the immediately preceding address 0C is overwritten by the tag 02 indicating 3 non-continuous data. The address 0C contains continuous data and is therefore a compressible portion.

As explained in the foregoing, the start of the continuous data is overwritten by the tag for such continuous data, and an address immediately preceding the start address of non-continuous data (end of continuous data) is overwritten by the tag of the succeeding non-continuous data.

Figure 7:
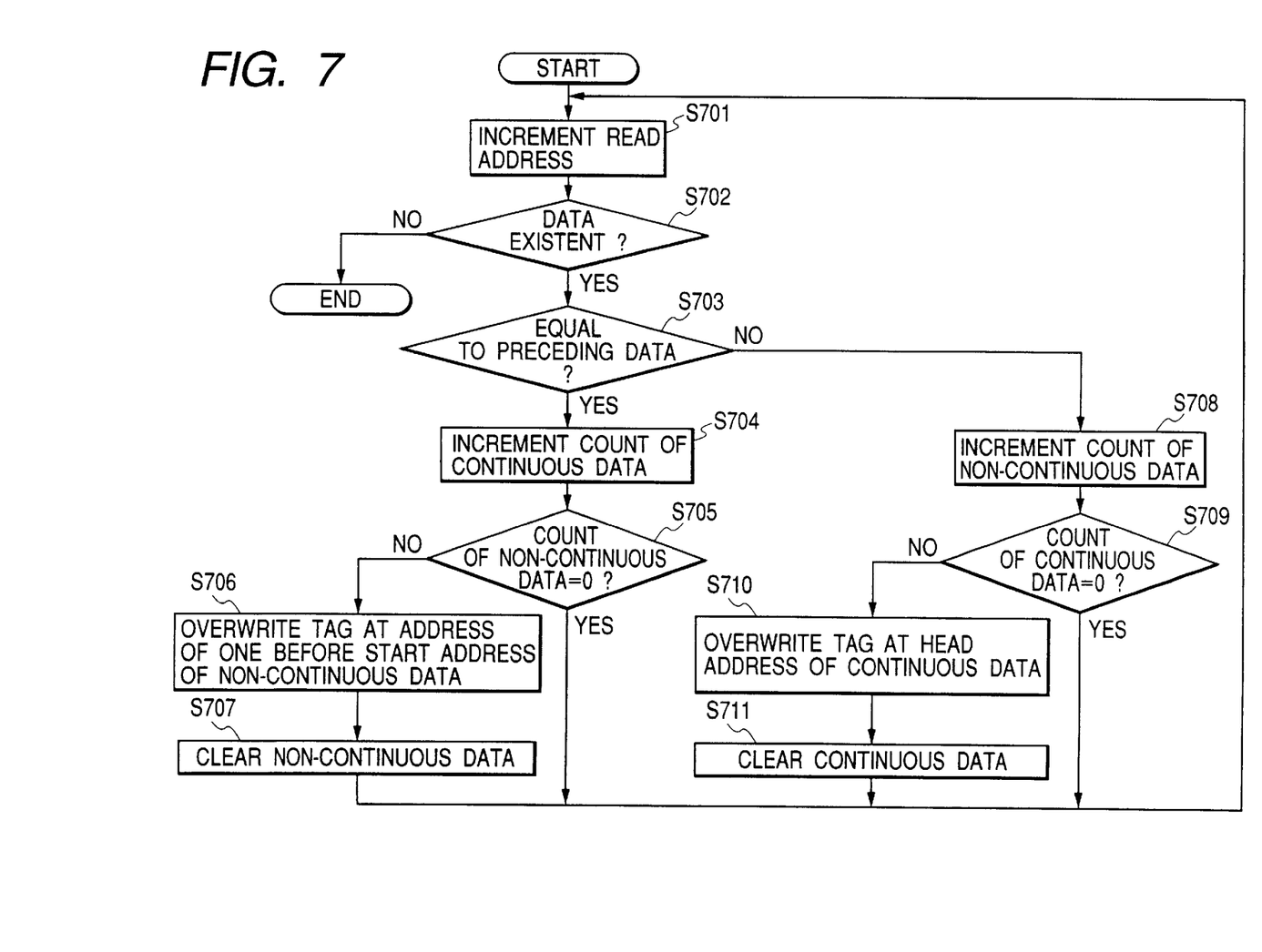
FIG. 7 is a flow chart showing the process in a tag generation unit.

The process executed by the tag generation unit 105 will be explained again with reference to a flow chart shown in FIG. 7.

At first the reading address of the pre-compression data reception bugger 101 is stepwise increased (step S701), and there is discriminated whether data are present at such address (step S702). If the data are absent, it is regarded that all the data in the pre-compression data reception buffer 101 are already processed and the sequence is terminated.

If the step S702 identifies that the data are present, there is discriminated whether such data are same as the immediately preceding data (step S703). If same, the count of the continuous data is stepwise increased (step S704), and there is discriminated whether the count of the non-continuous data is 0 (step S705). If the count of the non-continuous data is 0, the sequence returns to the step S701 for continuing the process.

If the count of the non-continuous data is not 0, indicating that the non-continuous data have been continued and that the continuous data appear here, a tag for the non-continuous data overwrites an address immediately preceding the start address of the non-continuous data (namely the end of preceding continuous data if such continuous data are present) (step S706). Then the count of the non-continuous data is cleared (step S707) and the sequence returns to the step S701 for continuing the process.

If the step S703 identifies that the data are different from the immediately preceding data, the count of the non-continuous data is stepwise increased (step S708), and there is discriminated whether the count of the continuous data is 0. If the count of the continuous data is 0, the sequence returns to the step S701 for continuing the process.

If the count of the continuous data is not 0, indicating that the continuous data have been continued and the non-continuous data appear here, a tag for the continuous data overwrites the start address of the continuous data (step S710). Then the count of the continuous data is cleared (step S711) and the sequence returns to the step S701 for continuing the process.

Through the above-described process, there are obtained, from the data stored in the pre-compression data reception buffer 101 as indicated in FIG. 2A, data overwritten by the tags as shown in FIG. 2B.

The tag/data selection unit 106 suitably reads the tag and the data from the pre-compression data reception buffer while analyzing the tag, and transfers them to the transfer control unit.

More specifically on the example shown in FIGS. 2A and 2B, the tag "03" written in a specified address such as the address immediately preceding the data storage area is read and transferred to the transfer control unit 104. Then the tag 03 is analyzed. Since the tag 03 indicates four non-continuous data, the data of the succeeding addresses 00 to 03 are transferred to the transfer control unit 104.

Then the tag "F8" written in the next address 04 is read and transferred to the transfer control unit 104. Then the tag F8 is analyzed. Since the tag F8 indicates nine continuous data, the data of the succeeding address 05 is transferred to the transfer control unit 104. Subsequently an inverted value of the tag is added to the address. In the example shown in FIG. 2A, F8h (1111 1000b) is inverted to obtain 07h (0000 0111b). Thus 07 is added to the current address 05 to obtain an address 0C.

Then the tag "02" written in thus set address 0C is read and transferred to the transfer control unit 104. Then the tag 02 is analyzed. Since the tag 02 indicates three non-continuous data, the data of the succeeding addresses 0D to 0F are transferred to the transfer control unit 104.

Thereafter the data stored in the pre-compression data reception buffer 101 are read in succession according to the value of the tag, and the data are transferred to the transfer control unit 104 in a format same as that of the data after ordinary compression.

Figure 8:
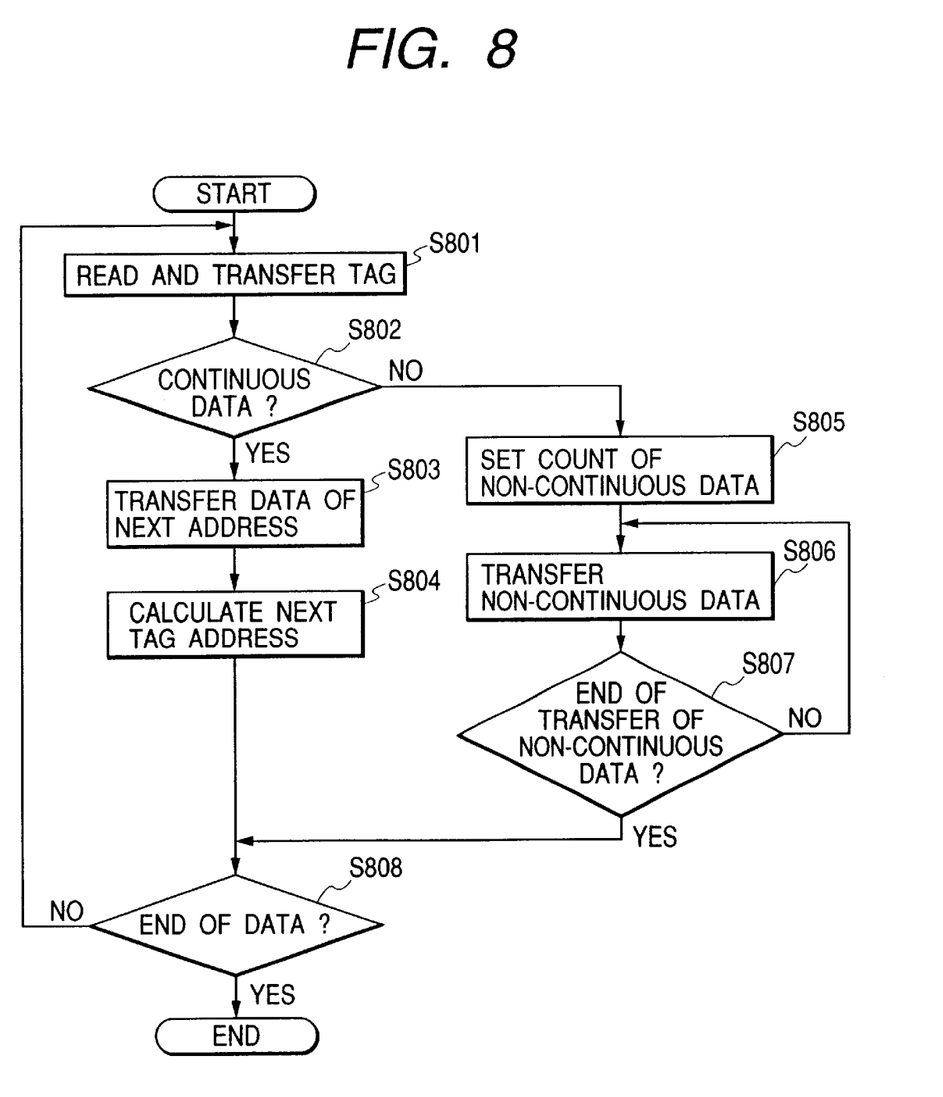
FIG. 8 is a flow chart showing the process in a tag/data selection unit.

In the following the process executed by the tag/data selection unit 106 will be explained again, with reference to a flow chart shown in FIG. 8.

At first the tag, written in a specified address such as the address immediately preceding the data storage portion, is read and transferred to the transfer control unit 104 (step S801). Then there is discriminated whether the read tag indicates continuous data or non-continuous data (step S802), If the tag indicates continuous data, the data of the next address is transferred to the transfer control unit 104 (step S803), and the address of the next tag address is calculated (step S804). More specifically, the tag data are inverted and added to the current address as explained in the foregoing.

On the other hand, if the tag indicates non-continuous data, after the number of the non-continuous data is set (step S805), the non-continuous data are transferred to the transfer control unit 104 (step S806), and there is discriminated whether the transfer is completed by the set number of the non-continuous data (step S807). Thereafter the steps S806 and S807 are repeated until the transfer is completed.

After the step S804 or after the step S807 identifies that the transfer of the non-continuous data is completed, there is discriminated whether the reading and transfer of the reception data, stored in the pre-compression data reception buffer 101, are completed (step S808), and, if not completed, the sequence returns to the step S801 to continue the process. If the step S808 identifies that the reading and transfer of the reception data are completed, the tag/data selection unit 106 terminates the process.

As explained in the foregoing, the tag/data selection unit 106 reads, in succession, the data stored in the pre-compression data reception buffer 101 and overwritten with the tags by the tag generation unit 105, according to the value of the tag and transfers such data to the transfer control unit 104 in a format same as that of the data after ordinary compression.

Since the data shown in FIGS. 2A and 2B contain non-continuous data in the beginning, the tag generation unit 105 writes the tag in a specified address such as the address immediately preceding the data storing portion and the tag/data selection unit 106 reads the tag from such specified address, but, if the continuous data are present in the beginning, the start address of such continuous data is overwritten with the tag. Therefore, it is preferred that the tag/data selection unit 106 at first discriminates whether the tag is written in the specified address and, if not written, reads the tag positioned at the start of the pre-compression data reception buffer 101.

In the embodiment explained in the foregoing, since the pre-compression data reception buffer is only overwritten with the tags generated by the tag generation unit, there can be omitted the process of rearranging the data and writing the data into the transfer buffer so that the process speed can be improved.

In the comparison of the number of writing, the conventional configuration shown in FIGS. 4A and 4B requires writings of tags of 3 bytes and data of 8 bytes, or 11 writing operations in total, while the configuration of the present embodiment requires writing of tags of 3 bytes only, so that the number of the writing operations is reduced to 3.

Also as the overwriting is executed on the pre-compression data reception buffer, the ordinary transfer buffer becomes unnecessary and there can be achieved a reduction in the cost.

The foregoing embodiment is explained as a specific example for understanding the present invention, and the person skilled in the art may suitably add modifications or alterations.

The present invention may be applied to a system consisting of plural equipment (for example host computer, interface devices, reader printer, etc.) or an apparatus consisting of a single equipment (such as a copying machine or a facsimile apparatus).

Also the objects of the present invention can be naturally be attained in a case where the memory medium (recording medium) storing the program codes of a software realizing the functions of the aforementioned embodiments is supplied to a system or an apparatus and the computer (or CPU or MPU) of the above-mentioned system or apparatus reads and executes the program codes stored in the memory medium. In such case the program codes read from the memory medium realize the functions of the aforementioned embodiments, and the memory medium storing the program codes constitutes the present invention. The present invention also includes not only a case where the functions of the aforementioned embodiments are realized by the execution of the read program codes by the computer but also a case where an operating system (OS) or the like functioning on the computer executes all or a part of the actual processes under the control of such program codes thereby realizing the functions of the aforementioned embodiments.

The present invention further includes a case wherein the program codes read from the memory medium are once stored in a memory provided in a function expansion board inserted into the computer or a function expansion unit connected to the computer, and a CPU provided in the function expansion board or the function expansion unit executes all the process or a part thereof according to the instructions of such program codes, thereby realizing the functions of the aforementioned embodiments.

In case the present invention is applied to the above-described memory medium, program codes corresponding to the aforementioned flow charts (shown in FIG. 7 and/or FIG. 8) may be stored in such memory medium.

As explained in the foregoing, the present invention allows, in compressing the data of the reception buffer by the pack bits compression, to dispense with the data rearrangement in such compression and to reduce the number of the writing operations, whereby the speed of data processing for data compression can be increased.

The present invention is particularly advantageous for example in a printer or the like having a scanner unit to be mounted on a carriage instead of a recording head, since the transfer time is reduced and the throughput is improved in transferring the image data, read by the scanner unit, to an external equipment such as a host equipment.

What is claimed is:

1. A data transfer method for compression transfer of data which includes a continuous data train consisting of same data in continuation and a non-continuous data train consisting of non-same data, the method comprising:

a step of reading data stored in a buffer;

a tag generation step, of generating a tag for the continuous data train or the non-continuous data train and overwriting a start or end of the continuous data train with the tag; and a data control step, of executing compression transfer of the data, by reading the tag from the buffer and transferring the data in the buffer according to the tag.

2. The method according to claim 1, wherein the buffer is a reception buffer for storing received data.

3. The method according to claim 2, wherein said tag generation step includes overwriting the start of an area for a continuous data train with a tag of the continuous data train and overwriting the end of an area of a continuous data train with a tag of a succeeding area of a non-continuous data train.

4. The method according to any of claims 1, 2, or 3, wherein said tag generation step includes, in a case where a non-continuous data train is present at the beginning of the data read from the buffer, writing the tag of the non-continuous data train in a specified area of the buffer.

5. The method according to claim 4, wherein said data control step includes a step of discriminating whether a tag is written in the specified area.

6. The method according to claim 5, wherein said data control step includes reading the tag from the start address of the buffer in a case where a tag is not written in the specified area.

7. A data transfer apparatus for compression transfer of data which includes a continuous data train consisting of same data in continuation and a non-continuous data train consisting of non-same data, the apparatus comprising:

a buffer, adapted to store data;

tag generation means for generating a tag for the continuous data train or the non-continuous data train and overwriting a start or end of the continuous data train with the tag; and data control means for executing compression transfer of the data, by reading the tag from said buffer and transferring the data in said buffer according to the tag.

8. The apparatus according to claim 7, wherein said buffer is a reception buffer for storing received data.

9. The apparatus according to claim 7, wherein the tag generation means overwrites the start of an area for a continuous data train with a tag of the continuous data train and overwrites the end of an area of a continuous data train with a tag of a succeeding area of a non-continuous data train.

10. The apparatus according to any of claims 7, 8 or 9, wherein the tag generation means is adapted, in a case where a non-continuous data train is present at the beginning of the data read from the buffer, to write the tag of the non-continuous data train in a specified area of the buffer.

11. The apparatus according to claim 10, wherein the data control means includes means for discriminating whether a tag is written in the specified area.

12. The apparatus according to claim 11, wherein the data control means is adapted to read the tag from the start address of the buffer in case a tag is not written in the specified area.

13. A recording apparatus comprising:

a data transfer apparatus according to claim 8, and a carriage, arranged to scan a recording medium by reciprocating motion.

14. A recording apparatus comprising:

a data transfer apparatus according to claim 9, and a carriage, arranged to scan a recording medium by reciprocating motion.

15. A recording apparatus comprising:

a data transfer apparatus for compression transfer of data which includes a continuous data train consisting of same data in continuation and a non-continuous data train consisting of non-same data, the data transfer apparatus comprising:

a buffer, adapted to store data;

tag generation means for generating a tag for the continuous data train or the non-continuous data train and overwriting a start or end of the continuous data train with the tag; and data control means for executing compression transfer of the data, by reading the tag from said buffer and transferring the data in said buffer according to the tag; and a carriage, arranged to scan a recording medium by reciprocating motion.

16. The recording apparatus according to claim 15, wherein:

said carriage is capable of mounting one of a scanner unit for reading a recorded image and a recording head; and said data transfer apparatus is adapted, in a case in which the scanner unit is mounted on said carriage, to transfer image data, read by the scanner unit, to other equipment by means of said data transfer apparatus.

17. The recording apparatus according to claim 16, wherein, in a case in which the recording head is mounted on said carriage, the recording head is an ink jet recording head for executing recording by discharging ink.

18. The recording apparatus according to claim 16, wherein, in a case in which the recording head is mounted on said carriage, the recording head discharges ink utilizing thermal energy, and is provided with an energy converting member adapted to generate thermal energy to be given to the ink.

* * * * *

UNITED STATES PATENT AND TRADEMARK OFFICE
CERTIFICATE OF CORRECTION

| | |
|---|---|
| PATENT NO. | : 6,757,758 B1 |
| APPLICATION NO. | : 09/625844 |
| DATED | : June 29, 2004 |
| INVENTOR(S) | : Masashi Matsumoto |

It is certified that error appears in the above-identified patent and that said Letters Patent is hereby corrected as shown below:

<u>COLUMN 1</u>

Line 56, "transfer" should read --transfers--.

<u>COLUMN 3</u>

Line 34, "then" should read --the--.

<u>COLUMN 4</u>

Line 24, "executes" should read --execute--.

<u>COLUMN 5</u>

Line 13, "RAM 1703," should read --DRAM 1703,--;
Line 30, "DRAM 1705," should read --DRAM 1703,--;
Line 48, "transfer control unit 106." should read
    --transfer control unit 104.--; and
Line 61, "read" should read --reads--.

<u>COLUMN 6</u>

Line 24, "bit" should read --bits--.

UNITED STATES PATENT AND TRADEMARK OFFICE
CERTIFICATE OF CORRECTION

PATENT NO. : 6,757,758 B1
APPLICATION NO. : 09/625844
DATED : June 29, 2004
INVENTOR(S) : Masashi Matsumoto It is certified that error appears in the above-identified patent and that said Letters Patent is hereby corrected as shown below:

<u>COLUMN 7</u>

Line 62, "S802)," should read --S802).--.

Signed and Sealed this

Second Day of September, 2008

JON W. DUDAS
*Director of the United States Patent and Trademark Office*